US010338106B2

(12) United States Patent
Kalokitis

(10) Patent No.: US 10,338,106 B2
(45) Date of Patent: *Jul. 2, 2019

(54) METHOD AND APPARATUS FOR DISCRIMINATION OF SOURCES IN STRAY VOLTAGE DETECTION

(71) Applicant: Power Survey LLC, Kearny, NJ (US)

(72) Inventor: David Kalokitis, Robbinsville, NJ (US)

(73) Assignee: Power Survey LLC, Secaucus, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 15/225,195

(22) Filed: Aug. 1, 2016

(65) Prior Publication Data
US 2016/0341771 A1 Nov. 24, 2016

Related U.S. Application Data

(63) Continuation of application No. 14/071,270, filed on Nov. 4, 2013, now Pat. No. 9,423,431, which is a (Continued)

(51) Int. Cl.
G01R 19/145 (2006.01)
G01R 29/12 (2006.01)
(Continued)

(52) U.S. Cl.
CPC ......... *G01R 19/145* (2013.01); *G01R 19/155* (2013.01); *G01R 29/0814* (2013.01);
(Continued)

(58) Field of Classification Search
None
See application file for complete search history.

(56) References Cited

U.S. PATENT DOCUMENTS 4,611,166 A 9/1986 Aslan
5,684,466 A 11/1997 Keating et al.
(Continued)

FOREIGN PATENT DOCUMENTS

EP 1233273 A2 8/2002
EP 1253429 A2 10/2002
(Continued)

OTHER PUBLICATIONS

J. D. Bowman, Hazard Surveillance for Industrial Magnetic Fields: II. Field Characteristics from Waveform Measurements, Ann. occup. Hyg., vol. 44, No. 8, pp. 615-633, 2000.*
(Continued)

*Primary Examiner* — Tung S Lau
(74) *Attorney, Agent, or Firm* — Moser Taboada

(57) ABSTRACT

A method and apparatus for discriminating between electric field sources. In one embodiment, the apparatus comprises a mobile detection system comprising a sensor probe for remotely measuring an electric field generated by an electric field source in a patrolled area; and a processor, coupled to the sensor probe, for processing data received from the sensor probe to generate a first field strength and at least a second field strength for determining whether the electric field source is potentially hazardous.

20 Claims, 3 Drawing Sheets

Related U.S. Application Data continuation of application No. 12/930,975, filed on Jan. 21, 2011, now Pat. No. 8,577,631.

(60) Provisional application No. 61/336,732, filed on Jan. 26, 2010.

(51) Int. Cl.
| | | |
|---|---|---|
| *G06T 11/20* | (2006.01) | |
| *G06T 11/60* | (2006.01) | |
| *G01R 19/155* | (2006.01) | |
| *G01R 29/08* | (2006.01) | |
| *G01R 29/10* | (2006.01) | |
| *G01R 29/14* | (2006.01) | |

(52) U.S. Cl.
CPC ..... *G01R 29/0871* (2013.01); *G01R 29/0878* (2013.01); *G01R 29/10* (2013.01); *G01R 29/12* (2013.01); *G01R 29/14* (2013.01); *G06T 11/206* (2013.01); *G06T 11/60* (2013.01)

(56) References Cited

U.S. PATENT DOCUMENTS

| | | | |
|---|---|---|---|
| 7,248,054 B2 | 7/2007 | Kalokitis et al. | |
| 7,253,642 B2 | 8/2007 | Kalokitis et al. | |
| 7,486,081 B2 | 2/2009 | Kalokitis et al. | |
| 8,482,273 B2 | 7/2013 | Kalokitis et al. | |
| 8,482,274 B2 | 7/2013 | Kalokitis et al. | |
| 8,536,856 B2 | 9/2013 | Kalokitis et al. | |
| 8,577,631 B2 | 11/2013 | Kalokitis | |
| 8,598,864 B2 | 12/2013 | Kalokitis et al. | |
| 2003/0167139 A1 | 9/2003 | Swartz et al. | |
| 2006/0139031 A1 | 6/2006 | Kalokitis et al. | |
| 2006/0139032 A1 | 6/2006 | Kalokitis et al. | |
| 2006/0232259 A1 | 10/2006 | Olsson et al. | |
| 2006/0279630 A1 | 12/2006 | Aggarwal et al. | |
| 2007/0179737 A1 | 8/2007 | Kalokitis et al. | |
| 2007/0279067 A1 | 12/2007 | Wiswell et al. | |
| 2008/0180113 A1 | 7/2008 | Tsamis et al. | |
| 2009/0027281 A1 | 1/2009 | Walters et al. | |
| 2009/0195255 A1* | 8/2009 | Kalokitis | G01R 29/0871 324/522 |
| 2011/0184679 A1* | 7/2011 | Kalokitis | G01R 19/145 702/65 |

FOREIGN PATENT DOCUMENTS

| | | |
|---|---|---|
| GB | 1279621 A | 6/1972 |
| JP | S5919874 A | 2/1984 |
| JP | 2007010438 A | 1/2007 |

OTHER PUBLICATIONS

Dr Neil Cherry, Evidence that Electromagnetic fields from high voltage powerlines and in buildings, are hazardous to human health, especially to young children, Apr. 8, 2001, 51 pages.*

J. Bowman, "Manual for measuring occupational electric and magnetic field exposures", U.S. Department of Health and Human Services, Oct. 1998, retrieved from: https://www.cdc.gov/niosh/docs/98-154/pdfs/98-154.pdf on Oct. 3, 2016, pp. 1-150.

"Mobile Stray Voltage Detection System", Model 8950/10, Electric and Magnetic Field Measurement, Narda Safety Test Solution, pp. 2.

"Stray (Contact) Voltage Sensor Test Report", L3 Communication, Narda Safety Test Solution, pp. 26, Apr. 15, 2010.

International Search Report and Written Opinion dated Dec. 27, 2011 for PCT Application No. PCT/US2011/022365.

"A Sensor System for Detecting Stray Voltages on Covers, Grates, Light Poles and Other Structures", Sarnoff Corporation, pp. 1-23, Dec. 31, 2002.

Extended European Search Report dated Mar. 1, 2018 for Application No. 11737506.3.

* cited by examiner

METHOD AND APPARATUS FOR DISCRIMINATION OF SOURCES IN STRAY VOLTAGE DETECTION

CROSS-REFERENCE TO RELATED APPLICATIONS

This application is a continuation of U.S. patent application Ser. No. 14/071,270 filed Nov. 4, 2013 entitled "Method and Apparatus for Discrimination of Sources in Stray Voltage Detection", which is a continuation of U.S. patent application Ser. No. 12/930,975 (Now U.S. Pat. No. 8,577,631), filed Jan. 21, 2011 entitled "Method and Apparatus for Discrimination of Sources in Stray Voltage Detection", which further claims benefit of U.S. Provisional Patent Application Ser. No. 61/336,732, filed Jan. 26, 2010, both of which are incorporated herein by reference in their entireties.

BACKGROUND OF THE INVENTION

Field of the Invention

The present invention relates to the detection of electric fields, and more particularly, to a method and apparatus for determining potentially hazardous energized objects.

Description of the Related Art

Power distribution systems, for example those in large metropolitan areas, are subject to many stresses, which may occasionally result in the generation of undesirable or dangerous anomalies. An infrequent but recurrent problem in power distribution infrastructures is the presence of "stray voltages" in the system. These stray voltages may present themselves when objects, such as manhole covers, gratings, street light poles, phone booths, and the like, become electrically energized (e.g., at 120V AC). These objects may become energized when an electrically conductive path is established between underground secondary cabling and these objects, for example, due to physical damage to electrical insulation that results in direct contact between electrically conductive elements, or through the introduction of water acting as a conductor. These energized objects present obvious dangers to people and animals in the general public.

In order to identify energized objects throughout a large area, such as a large urban area, a mobile system may be utilized to traverse the area and remotely (i.e., in a non-contact manner) detect stray voltages on energized objects. One technique for detecting such stray voltages is by measuring the electric field pattern exhibited by energized objects at the fundamental power line frequency (e.g., 60 Hz in the U.S., 50 Hz in Europe and parts of Asia).

During the remote detection of stray voltages, a "false positive" may occur when an object emits an electric field pattern resembling that of a potentially hazardous energized structure while not being energized in a fashion that could cause shock or electrocution. For example, a "Don't Walk" pedestrian crossing signal often employs LED's that emit an electric field pattern similar to that of a potentially hazardous energized structure even though the LED's and their electrical connections are well protected from contact and no shock hazard exists. Discriminating between potentially hazardous energized structures and these false positives requires a technician operating a mobile detection system to stop and make time-consuming manual inspections of the structure.

Therefore, there exists a need in the art for efficiently discriminating between potentially hazardous energized objects and potentially non-hazardous sources of electric field.

SUMMARY OF THE INVENTION

Embodiments of the present invention generally relate to a method and apparatus for discriminating between electric field sources. In one embodiment, the apparatus comprises a mobile detection system comprising a sensor probe for remotely measuring an electric field generated by an electric field source in a patrolled area; and a processor, coupled to the sensor probe, for processing data received from the sensor probe to generate a first field strength and at least a second field strength for determining whether the electric field source is potentially hazardous.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to apparatus and methods for discriminating between potentially hazardous and non-hazardous sources of electric fields. For purposes of clarity, and not by way of limitation, illustrative depictions of the present invention are described with references made to the above-identified drawing figures. Various modifications obvious to one skilled in the art are deemed to be within the spirit and scope of the present invention.

Figure 1:
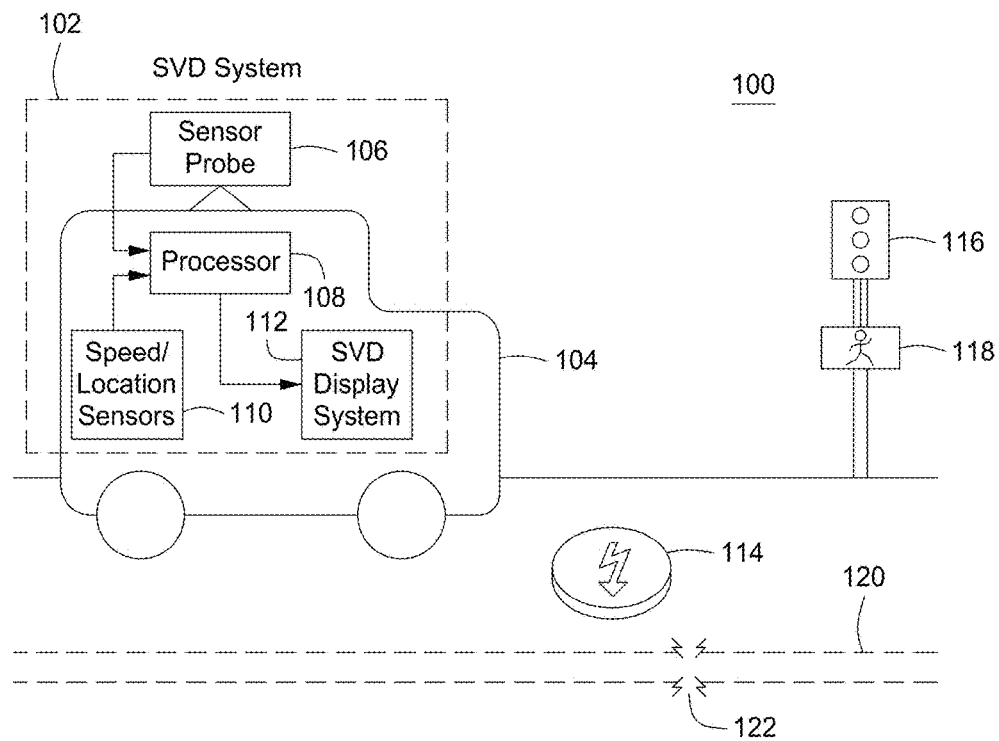
FIG. 1 is a block diagram of a system for detecting potentially hazardous energized structures in accordance with one or more embodiments of the present invention.

FIG. 1 is a block diagram of a system 100 for detecting potentially hazardous energized structures in accordance with one or more embodiments of the present invention. The system 100 comprises a stray voltage detection (SVD) system 102, a mobile vehicle 104, a potentially hazardous energized manhole cover 114, and a streetlight 116 coupled to a pedestrian crossing sign 118 that is a potentially non-hazardous source of an electric field. Additionally, the system 100 comprises subterranean power distribution system cabling 120, the cabling 120 having a fault 122 (such as insulation damage).

The fault 122 results in the manhole cover 114 being electrically energized by a power line conductor within the cabling 120, causing the manhole cover 110 to exhibit an electric field pattern primarily at the fundamental frequency of the power line (e.g., 60 Hz for a U.S. power distribution system). The manhole cover 114, energized in such a way, exhibits a voltage at its surface (i.e., a stray voltage) and thus presents a potential electric shock hazard to a pedestrian or animal coming in contact with the manhole cover 114. In one or more alternative embodiments, the manhole cover 114 and/or other objects may become similarly energized in a potentially hazardous fashion due to other types of electrical system faults; for example, a street light may become energized due to an electrical fault within the street light that shorts the power line conductor to the street light casing.

In contrast to the manhole cover 114, the crossing sign 118 is electrically energized by a power source but does not exhibit a voltage at its surface. The crossing sign 118 thus generally does not represent a potential electric shock hazard. The crossing sign 118 comprises light emitting diodes (LEDs) that emit an electric field pattern similar to that of a potentially hazardous energized object (e.g., the manhole cover 114) but, due to a rectification occurring in the diode structure of the LEDs, additionally comprises a relatively large component at one or more frequencies other than the fundamental power line frequency, such as, a harmonic of the fundamental power line frequency. In some alternative embodiments, the crossing sign 118 and/or other objects may similarly act as a potentially non-hazardous electric field source and exhibit an analogous electric field pattern having significant components at one or more frequencies other than the fundamental power line frequency, such as, a harmonic of the fundamental power line frequency.

The SVD system 102 is capable of detecting and providing an indication of stray voltages present on hazardous energized objects, such as the manhole cover 114, as well as discriminating between such potentially hazardous energized objects and potentially non-hazardous electric field sources, such as the crossing sign 118. The SVD system 102 is generally transported by the mobile vehicle 104, which may be a car, van, truck, cart, or the like, for patrolling an area to identify potentially hazardous energized objects. The SVD system 102 comprises a sensor probe 106, location sensors 110, and an SVD display system 112, each coupled to a processor 108.

The sensor probe 106 may be mounted to the mobile vehicle 104, towed by the mobile vehicle 104, or similarly conveyed by the mobile vehicle 104 for measuring an electric field in the area patrolled by the mobile vehicle 104. The sensor probe 106 produces one or more electrical signals representative of strength of the electric field in the area, and couples the generated electrical signals to the processor 108. Examples of such a sensor probe may be found in commonly assigned U.S. Pat. No. 7,248,054, entitled "Apparatus and Method for Detecting an Electric Field", issued Jul. 24, 2007; commonly assigned U.S. Pat. No. 7,253,642, entitled "Method for Sensing an Electric Field", issued Aug. 7, 2007; and commonly assigned U.S. patent application publication number 2009/0195255 entitled "Apparatus and Method for Monitoring and Controlling Detection of Stray Voltage Anomalies" and filed Jan. 21, 2009. In some embodiments, more than one sensor probe 106 may be utilized for measuring the electric field. Additionally or alternatively, the SVD system 102 may further comprise one or more components known in the art, such as filters, analog to digital converters (ADC), amplifiers, and the like, for processing the electrical signals generated by the sensor probe 106.

The processor 108 processes the electrical signals received from the sensor probe 106 to generate a first field strength—i.e., a measurement of the electric field strength at the fundamental frequency of the power distribution system ("field strength at a first frequency") for providing an indication of a stray voltage present on an object. In some embodiments, the power distribution system may have a fundamental frequency of 60 Hz; in other embodiments, the power distribution system may be at a different frequency, such as 50 Hz. The field strength at the first frequency may be used to generate the stray voltage indication as a visual indication displayed by the SVD display system 112; for example, a graphical display of the field strength at the first frequency compared to a threshold. Additionally or alternatively, the field strength at the first frequency may be used to generate a stray voltage indication as an audible indication, such as a continuous tone proportional in pitch to the strength of the first electric field strength value. In such embodiments where an audible stray voltage indication is generated, the processor 108 and/or the SVD display system 112 comprises a speaker for presenting the audible indication.

The processor 108 additionally receives information from the speed/location sensors 110 for determining a speed and/or a location of the sensor probe 106, as well as a time stamp corresponding to sensor probe measurements obtained. The speed/location sensors 110 may include one or more of a wheel speed sensor, a wheel revolution sensor, a Global Positioning System (GPS) receiver, an imaging device (e.g., a camera, video camera, stereo camera, or the like), a speed sensor, a location device, or the like, for obtaining speed and/or location data and providing such data to the processor 108. The speed and/or location data may be utilized by the processor 108 during processing to generate the field strength at a first frequency; correlated with the electrical signals and/or field strength at a first frequency for display and/or storage; displayed on the display system 112; or similarly utilized by the SVD system 102.

The SVD display system 112 provides a means for displaying data to a user, such as the electrical signals generated by the sensor probe 106, speed and/or location data obtained by the speed/location sensors 110, processed data from the processor 108 (e.g., the field strength at a first frequency), and/or combinations of the aforementioned. In some embodiments, one or more of the speed/location sensors 110 may additionally or alternatively be coupled directly to the SVD display system 112 for displaying speed and/or location data. The SVD display system 112 may comprise a graphical user interface (GUI) for displaying data as well as providing operative control of the SVD system 102; additionally, the SVD display system 112 may comprise a conventional laptop computer for storing data and/or for further analysis of data.

Examples of a system such as the SVD system 102 for indicating a stray voltage at a fundamental power line frequency may be found in commonly assigned U.S. Pat. No. 7,248,054, entitled "Apparatus and Method for Detecting an Electric Field", issued Jul. 24, 2007; commonly assigned U.S. Pat. No. 7,253,642, entitled "Method for Sensing an Electric Field" and issued Aug. 7, 2007; commonly assigned U.S. Pat. No. 7,486,081, entitled "Apparatus and Method for Monitoring and Controlling Detection of Stray Voltage Anomalies" and issued Feb. 3, 2009; and commonly assigned U.S. patent application publication number 2009/0195255, entitled "Apparatus and Method for Monitoring and Controlling Detection of Stray Voltage Anomalies" and filed Jan. 21, 2009.

In accordance with one or more embodiments of the present invention, the processor 108 generates a second field strength and a third field strength—i.e., measurements of the electric field strength at a second and a third frequency ("field strength at a second frequency" and "field strength at a third frequency", respectively), based on the electrical signals received from the sensor probe 106. The second and third frequencies may be second and third harmonics of the power distribution system's fundamental frequency, although they are not limited to harmonics of the fundamental frequency. The field strengths at the first, second, and/or third frequencies may then be compared in order to discriminate between potentially hazardous energized objects (e.g., the manhole cover 114) and potentially non-hazardous sources of electric fields (e.g., the crossing sign 118). The comparison of the field strengths may be expressed in absolute and/or relative values.

Field strength measurements at other frequencies may additionally or alternatively be utilized. In some embodiments, the processor 108 performs narrow band filtering at each frequency measured, including the measurement at the fundamental frequency.

In some embodiments, the processor 108 may compare the field strengths at the first, second, and/or third frequencies and generate an indication, such as a visual and/or audible alarm, or the like, signifying whether an object is determined to be a potentially hazardous or non-hazardous source of the electric field. Additionally or alternatively, the processor 108 may generate a graphical display of the field strengths at the first, second, and/or third frequencies for presentation by the SVD display system 112. In some such embodiments, the graphical display may be correlated with location information, such as visual imagery, latitude/longitude, an address, or the like, corresponding to the locations at which the electric field strength was measured by the sensor probe 106. In an alternative embodiment, the processor 108 may additionally or alternatively compute the electric field strength at one or more other frequencies for additional analysis of stray voltages.

Some specific objects, such as the crossing sign 118, may be characterized by a group of field strength values exhibiting a certain signature and thereby recognized as being typically non-hazardous objects. For example, if the field strengths for a measured object at the second and third frequencies satisfy first and second thresholds, respectively, related to the field strength at the first frequency (e.g., the field strength at the second frequency is greater than 10% of the fundamental frequency level and the field strength at the third frequency is less than 5% of the fundamental frequency level), the object may be determined to be the crossing sign 118. Additionally or alternatively, other types of signature analysis may be utilized. For objects that may be so characterized and determined to be typically non-hazardous objects, the SVD system 102 may provide a specific indication that the object is typically non-hazardous and requires no further investigation. Alternatively, the SVD system 102 may suppress an indication (e.g., a visual alarm, an audible alarm, or the like) of a detected electric field radiated from the object. Such characterization of typically non-hazardous objects may thereby improve the speed and efficiency of identifying potentially hazardous objects by allowing the user to bypass typically non-hazardous objects that are radiating an electric field.

Figure 2:
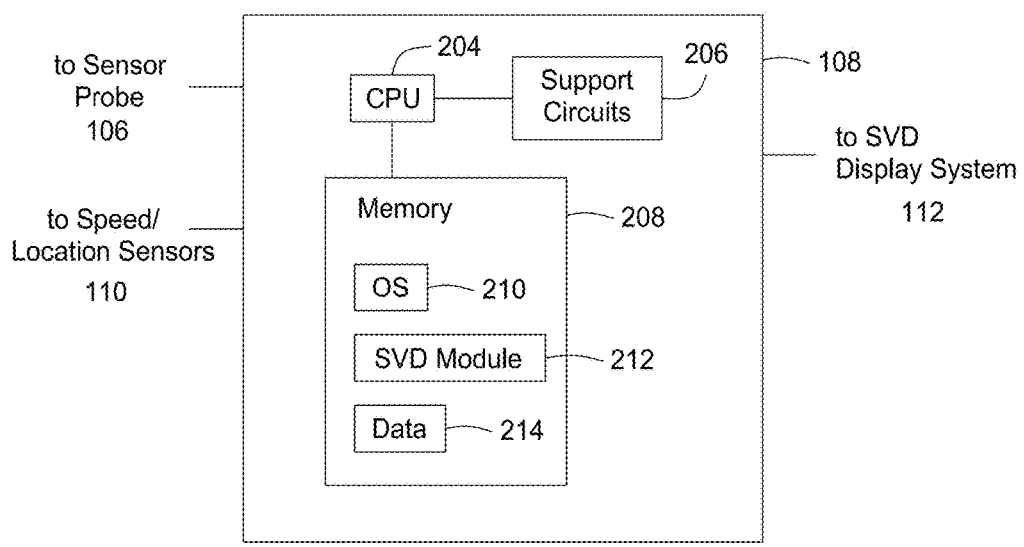
FIG. 2 is a block diagram of a processor in accordance with one or more embodiments of the present invention.

FIG. 2 is a block diagram of a processor 108 in accordance with one or more embodiments of the present invention. The processor 108 comprises a central processing unit (CPU) 204 coupled to support circuits 206 and a memory 208.

The CPU 204 may comprise one or more conventionally available microprocessors. Alternatively, the CPU 204 may include one or more application specific integrated circuits (ASICs). The support circuits 206 are well known circuits used to promote functionality of the CPU 204 and may include, but are not limited to, a cache, power supplies, clock circuits, buses, network cards, input/output (I/O) circuits, and the like.

The memory 208 may comprise random access memory, read only memory, removable disk memory, flash memory, and various combinations of these types of memory. The memory 208 is sometimes referred to as main memory and may, in part, be used as cache memory or buffer memory. The memory 208 generally stores the operating system (OS) 210 of the processor 108. The OS 210 may be one of a number of commercially available operating systems such as, but not limited to, SOLARIS from SUN Microsystems, Inc., AIX from IBM Inc., HP-UX from Hewlett Packard Corporation, LINUX from Red Hat Software, Windows 2000 from Microsoft Corporation, and the like.

The memory 208 may store various forms of application software, such as stray voltage detection (SVD) module 212. Additionally, the memory 208 may store data 214 that is related to the operation of the SVD system 102.

The SVD module 212 processes the electrical signals received from the sensor probe 106 to generate the field strengths at the first, second, and third frequencies. Generally, narrow band filtering is performed at each frequency measured. In some embodiments, the electrical signals from the sensor probe 106 are sampled every $1/960^{th}$ of a second prior to processing by the SVD module 212; other sampling rates may alternatively be used, and the electrical signals may additionally be amplified and/or filtered prior to being sampled.

In some embodiments, the received signal may be digitized and the SVD module 212 generates the field strengths at the first, second, and third frequencies by computing a fast Fourier transform (FFT) of the sampled electrical signals to obtain a frequency domain representation of the electric field. The SVD module 212 then computes a magnitude squared of the frequency component at the first frequency, the frequency component at the second frequency, and the frequency component at the third frequency (e.g., the fundamental power line frequency, the second harmonic, and the third harmonic); in one or more alternative embodiments, the SVD module 212 may additionally or alternatively compute strengths of the electric field at one or more other frequencies for use in analyzing stray voltages. In some embodiments, the SVD module 212 may utilize speed and/or location data from the speed/location sensors 110 when computing the electric field strengths; e.g., the speed and/or location data may be utilized to normalize the computed electric field strengths with respect to time and amplitude.

Examples of a technique for computing an electric field strength at 60 Hz, such as that used by the SVD module 212, may be found in commonly assigned U.S. Pat. No. 7,248,054, entitled "Apparatus and Method for Detecting an Electric Field", issued Jul. 24, 2007; commonly assigned U.S. Pat. No. 7,253,642, entitled "Method for Sensing an Electric Field" and issued Aug. 7, 2007; and commonly assigned U.S. patent application publication number 2009/

0195255, entitled "Apparatus and Method for Monitoring and Controlling Detection of Stray Voltage Anomalies" and filed Jan. 21, 2009. Such a technique may additionally be utilized for computing an electric field strength at other frequencies.

In some other embodiments, a demodulation scheme may be employed to separate the frequencies for determining the field strengths at the fundamental frequency and at least one other frequency.

The computed field strengths at the first, second, and third frequencies may be graphically displayed, for example as described below with respect to FIG. 3, on the SVD display system 112 for discriminating between potentially hazardous energized objects and potentially non-hazardous electric field sources. The processor 108 may correlate the computed field strengths with location and/or time data from the speed/location sensors 110 for display on the SVD display system 112 and/or for storage in the data 214. In some embodiments, the processor 108 may comprise a transceiver for remotely communicating data.

Figure 3:
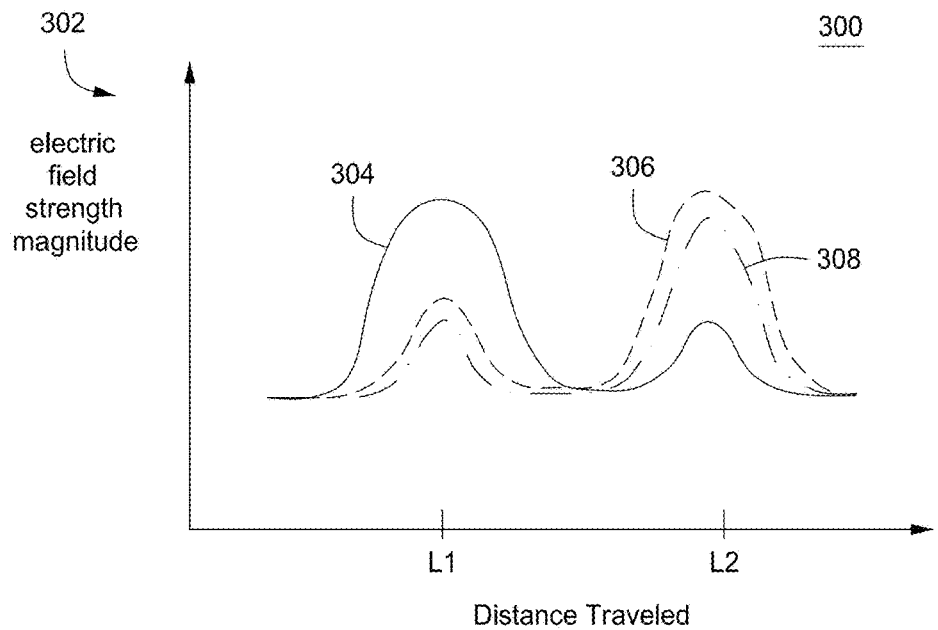
FIG. 3 is a graphical diagram for discriminating between potentially hazardous and non-hazardous electric field sources in accordance with one or more embodiments of the present invention.

FIG. 3 is a graphical diagram 300 for discriminating between potentially hazardous and non-hazardous electric field sources in accordance with one or more embodiments of the present invention. The graphical diagram 300 comprises a graph 302 representing electric field strength magnitude on a Y-axis and distance traveled by the SVD system 102/mobile vehicle 104 on an X-axis. The graphical diagram 300 further comprises plots 304, 306, and 308 of computed field strengths at 60 Hz, 120 Hz, and 180 Hz (i.e., the fundamental frequency of the power line and the first and second harmonics), respectively, along the route traversed by the SVD system 102/mobile vehicle 104. Although plots 306 and 308 depict the computed field strengths at harmonics of the power line fundamental frequency, computed field strengths at frequencies not harmonically related may be utilized. In some embodiments, computed field strengths at fewer or more frequencies may be determined and graphically displayed.

At a first location $L_1$, representative of a location proximate the manhole cover 114, the 60 Hz plot 304 exhibits a peak magnitude that is much greater than a magnitude of the 120 Hz plot 306 and a magnitude of the 180 Hz plot 308 at the location $L_1$, thereby indicating a potentially hazardous charged object proximate the location $L_1$ (i.e., the manhole cover 114). Additionally or alternatively, other measures may be utilized for determining a potentially hazardous charged object, such as comparing one or more ratios of the computed field strengths to one or more thresholds. At a second location $L_2$, representative of a location proximate the crossing sign 118, the 60 Hz plot 304 exhibits a much smaller magnitude than a peak magnitude of the 120 Hz plot 306 and the 180 Hz plot 308, thereby indicating a potentially non-hazardous source of an electric field proximate the location $L_2$ (i.e., the crossing sign 118).

In one or more other embodiments, the magnitude of plots 306 and/or 308 need not be greater or less than the magnitude of plot 304 to determine that an electric field source is potentially hazardous or non-hazardous; such a determination may be made based on the existence of the electric field components at 120 Hz and/or 180 Hz and their relative strengths with respect to the electric field strength at 60 Hz. Ratios may be greater than, equal to, or less than 100%.

Figure 4:
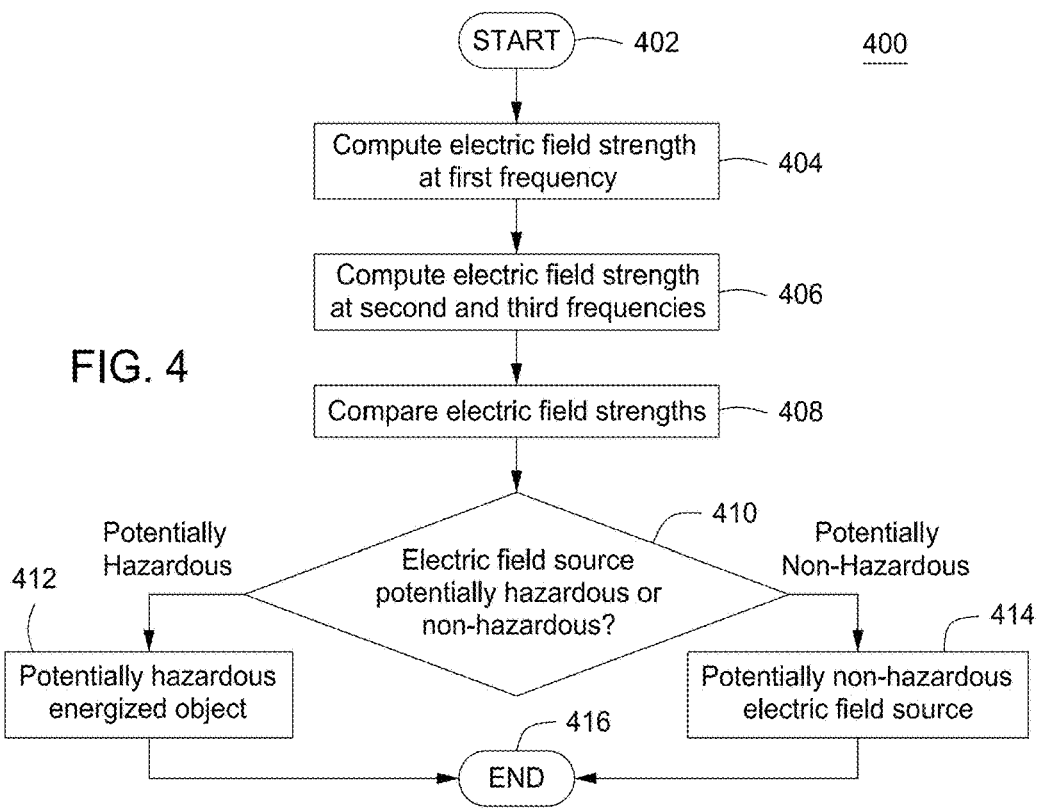
FIG. 4 is a flow diagram of a method for discriminating between potentially hazardous and non-hazardous electric field sources in accordance with one or more embodiments of the present invention.

FIG. 4 is a flow diagram of a method 400 for discriminating between potentially hazardous and non-hazardous electric field sources in accordance with one or more embodiments of the present invention. In some embodiments, a stray voltage detection (SVD) system, such as the SVD system 102, is utilized to remotely (i.e., in a non-contact fashion) detect objects energized by stray voltages from a power distribution system and to discriminate between potentially hazardous energized objects and potentially non-hazardous sources of electric fields. While traversing a particular route being scanned for stray voltages, the SVD system remotely measures an electric field along the route (i.e., without contact to any objects along the route) and computes strengths of the electric field for identifying and discriminating between potentially hazardous and non-hazardous sources of the electric field.

The method 400 starts at step 402 and proceeds to step 404. At step 404, the electric field at a particular location is remotely measured and a strength of the electric field at the fundamental frequency of the power distribution system ("field strength at a first frequency") is computed, for example, as previously described with respect to FIG. 2. In some embodiments, the power distribution system may be a U.S. power distribution system having a fundamental frequency of 60 Hz; alternatively, the power distribution system may have a different fundamental frequency, such as a 50 Hz power distribution system utilized in Europe and parts of Asia.

The method 400 proceeds to step 406, where strengths of the electric field at the second and third harmonics of the fundamental frequency ("field strength at a second frequency" and "field strength at a third frequency", respectively) are computed, for example, also as previously described with respect to FIG. 2. In some embodiments, where the power distribution system is a U.S. power distribution system, the second and third harmonics are at 120 Hz and 180 Hz, respectively. Generally, narrow band filtering is performed at each frequency measured. In some alternative embodiments, strength of the electric field at one or more other frequencies, not necessarily harmonically related to the fundamental frequency, may additionally or alternatively be determined for analysis of stray voltages. In some other alternative embodiments, the strength of the electric field is only determined at the first and second frequencies for use in the method 400.

The method 400 proceeds to step 408, where the computed field strengths are compared. In some embodiments, the computed field strengths are graphically displayed, such as previously described with respect to FIG. 3, for a user to visually distinguish between potentially hazardous and non-hazardous electric field sources based on the relative strengths of the electric field at the first, second, and/or third frequencies. The computed field strengths may be correlated with and displayed with corresponding location and/or time information, such as video imagery and/or time stamp data obtained while measuring the electric field with the SVD system. Additionally or alternatively, the computed field strengths may be analyzed by a processor of the SVD system for determining whether the electric field source is potentially hazardous or non-hazardous; for example, one or more ratios of the computed field strengths may be calculated and compared to one or more thresholds for making such a determination. The SVD system may further generate a visual and/or audible indication to signify whether the electric field source is potentially hazardous or non-hazardous.

In some embodiments, some or all of the data pertaining to the SVD system, such as raw data obtained by the SVD system, data processed by the SVD system, and the like, may be remotely communicated and/or stored for subsequent analysis.

The method 400 proceeds to step 410, where a determination is made whether the comparison of the computed field strengths indicates that the electric field source is potentially hazardous or non-hazardous. In some embodiments, an object may be considered potentially hazardous or non-hazardous based on the relative levels of the computed field strengths; for example, an object may be considered potentially hazardous if the computed field strength at the fundamental frequency is substantially greater than the computed field strengths at the second and third harmonics at a particular location proximate the object. As previously described, such a determination may be made visually by a user viewing a graphical display of the computed field strengths and/or by a processor of the SVD system analyzing the computed field strengths. Additionally, one or more computed field strengths, either alone or in combination, may exhibit a signature for identifying a specific type of potentially hazardous or non-hazardous object, such as a streetlight, a crossing sign, a manhole cover, or the like. Such a signature may be determined, for example, by comparing a plurality of computed field strengths to one another (e.g., by comparing the field strength at a first frequency to one or more previous computations of field strength at the first frequency taken at the same location), by comparing one or more computed field strengths to one or more signature templates or profiles, by comparing one or more relative values of computed field strengths to one or more thresholds, or by a similar signature identification technique. Such e-field signatures may then be stored for use in identifying potentially hazardous/non-hazardous energized structures.

For objects that may be characterized by such a signature and determined to be typically non-hazardous objects, the SVD system may provide a specific indication that the object is typically non-hazardous and requires no further investigation. Alternatively, the SVD system may suppress an indication (e.g., a visual alarm, an audible alarm, or the like) of a detected electric field radiated from the object. Such characterization of typically non-hazardous objects may thereby improve the speed and efficiency of identifying potentially hazardous objects by allowing the user to bypass typically non-hazardous objects that are radiating an electric field.

If, at step 410, it is determined that the comparison of the computed field strengths indicates that that the object is potentially hazardous, the method 400 proceeds to step 412 and concludes that the object is a potentially hazardous energized object. In some embodiments, the SVD system may provide a visual and/or audible indication of such a conclusion. The method 400 then proceeds to step 416 where it ends.

If, at step 410, it is determined that the comparison of the computed field strengths indicates that the electric field source is potentially non-hazardous, the method 400 proceeds to step 414 and concludes that the object is a potentially non-hazardous electric field source. In some embodiments, the SVD system may provide a visual and/or audible indication of such a conclusion. The method 400 then proceeds to step 416 where it ends.

Figure 5:
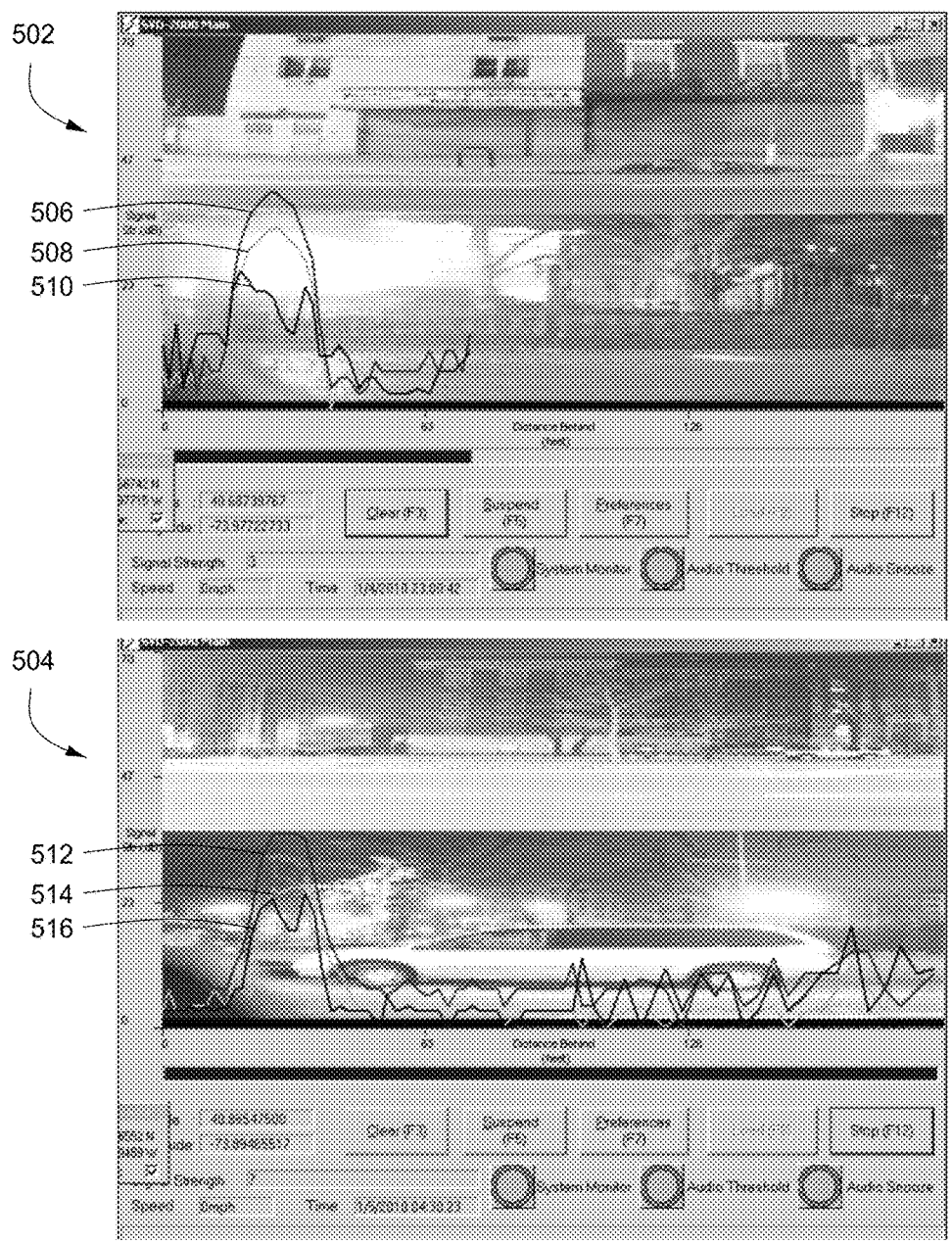
FIG. 5 is a pair of graphical diagrams depicting exemplary data for discriminating between potentially hazardous and non-hazardous electric field sources in accordance with one or more embodiments of the present invention.

FIG. 5 is a pair of graphical diagrams 500 depicting exemplary data for discriminating between potentially hazardous and non-hazardous electric field sources in accordance with one or more embodiments of the present invention. The graphical diagrams 500 comprise graphs 502 and 504 representing electric field strength magnitude on a Y-axis and distance traveled by the SVD system 102/mobile vehicle 104 on an X-axis. In some embodiments, such as the embodiment depicted in FIG. 5, the power distribution system operates at a fundamental frequency of 60 Hz; alternatively, the power distribution system may operate at a different fundamental frequency, such as 50 Hz.

Graph 502 comprises plots 506, 508, and 510 of computed field strengths at 60 Hz, 120 Hz, and 180 Hz (i.e., the fundamental frequency of the power line and the first and second harmonics), respectively, along a first route traversed by the SVD system 102/mobile vehicle 104. Plots 506, 508, and 510 are overlaid on correlated visual imagery additionally obtained along the first route by the SVD system 102. Although plots 508 and 510 depict computed field strengths at harmonics of the power line fundamental frequency, computed field strengths at frequencies not harmonically related may be utilized. At location $L_1$, the relative strengths of the plots 506, 508, and 510 indicate a potentially non-hazardous source of an electric field proximate the location $L_1$. In some embodiments, the plots 506, 508, and/or 510, or a combination thereof, may exhibit a signature identifying a specific type of potentially non-hazardous electric field source, such as a pedestrian crossing sign that emits an electric field pattern similar to that of a potentially hazardous energized object but does not exhibit a voltage at its surface. Such a signature may be determined, for example, by a relative comparison of the plots 506, 508, and/or 510, by comparing one or more of the plots 506, 508, and 510 to one or more signature templates or profiles, or by a similar signature identification technique.

Graph 504 comprises plots 512, 514, and 516 of computed field strengths at 60 Hz, 120 Hz, and 180 Hz, respectively, along a second route traversed by the SVD system 102/mobile vehicle 104. Plots 512, 514, and 516 are overlaid on correlated visual imagery additionally obtained along the second route by the SVD system 102. Although plots 514 and 516 depict computed field strengths at harmonics of the power line fundamental frequency, computed field strengths at frequencies not harmonically related may be utilized. At location $L_2$, the relative strengths of the plots 512, 514, and 516 indicate a potentially hazardous charged object proximate the location $L_2$. In some embodiments, the plots 512, 514, and/or 516, or a combination thereof, may exhibit a signature identifying a specific type of potentially hazardous electric field source, such as a streetlight, a manhole cover, or the like, having a potentially hazardous energized surface. Such a signature may be determined, for example, by a relative comparison of the plots 512, 514, and/or 516; by comparing one or more of the plots 512, 514, and 516 to one or more signature templates or profiles; or by a similar signature identification technique.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. An apparatus for identifying hazardous electric field sources, the apparatus comprising:
   a mobile detection system comprising:
      a sensor probe for measuring electric fields generated by one or more electric field sources proximate to the mobile detection system;

a processor for executing computer-executable instructions, stored on a memory coupled to the processor, the instructions comprising:
  determining a ratio between first and second strength components of the electric fields, the first strength component at a first frequency and the second strength component at a second frequency; and
  comparing the ratio with signatures of known electric field sources to determine whether a hazardous electric field exists;
a location sensor for collecting location data of the mobile detection system; and
a display that displays electric field data correlated to imagery based on the location data, wherein the hazardous electric fields are indicated on the display.

2. The apparatus of claim 1, wherein the first strength components are at one or more harmonics of a power distribution system's fundamental frequency.

3. The apparatus of claim 2, wherein the second strength components are at the power distribution system's fundamental frequency.

4. The apparatus of claim 2, wherein a first frequency from the one or more harmonics is a fundamental frequency of a power distribution system.

5. The apparatus of claim 1, wherein the first and second strength components of the electric fields measured by the sensor probe are at a plurality of harmonic frequencies, $10^{th}$ order and lower.

6. The apparatus of claim 1, wherein the first and second strength components are field strength measurements at, respectively, one or more frequencies.

7. The apparatus of claim 1, wherein the first strength components and second strength components are each normalized with respect to time and amplitude.

8. The apparatus of claim 1, wherein the imagery comprises images and video corresponding to a location of the mobile detection system, overlaid with plots of the electric fields at various frequencies.

9. The apparatus of claim 8, wherein the imagery is overlain on a horizontal plane relative to a plane of motion of the mobile detection system.

10. The apparatus of claim 9, wherein hazardous objects are identified by the processor by comparing one or more of the plots of the electric fields to known profiles of hazardous objects.

11. The apparatus of claim 10, wherein the various frequencies include at least 60 Hz, 120 Hz and 180 Hz.

12. The apparatus of claim 1, further comprising an imaging device for collecting the imagery of a proximate area of the mobile detection system.

13. A method for identifying hazardous electric field sources comprising:
  measuring, via a sensor probe coupled to a vehicle, electric fields generated by one or more electric field sources proximate to the vehicle;
  determining, by a processor, a ratio between first and second strength components of the electric fields, the first strength component at a first frequency and the second strength component at a second frequency;
  comparing, by the processor, the ratio with signatures of known electric field sources to determine whether a hazardous electric field exists;
  collecting, via a location sensor, location data of the vehicle;
  displaying, by a display, electric field data correlated to imagery based on the location data, wherein the hazardous electric fields are indicated on the display.

14. The method of claim 13, wherein the first strength components are at one or more harmonics of a power distribution system's fundamental frequency.

15. The method of claim 14, wherein the second strength components are at the power distribution system's fundamental frequency.

16. The method of claim 14, wherein a first frequency from the one or more harmonics is a fundamental frequency of a power distribution system.

17. The method of claim 13, wherein the first and second strength components are field strength measurements at, respectively, one or more frequencies.

18. The method of claim 13, wherein the first strength components and second strength components are each normalized with respect to time and amplitude.

19. The method of claim 13, wherein the imagery comprises images and video corresponding to a location of the vehicle, overlaid with plots of the electric fields at various frequencies.

20. The method of claim 19, wherein the imagery is overlain on a horizontal plane relative to a plane of motion of the vehicle.

* * * * *